United States Patent [19]

Coffey et al.

[11] Patent Number: 5,583,725

[45] Date of Patent: *Dec. 10, 1996

[54] SPIN VALVE MAGNETORESISTIVE SENSOR WITH SELF-PINNED LAMINATED LAYER AND MAGNETIC RECORDING SYSTEM USING THE SENSOR

[75] Inventors: Kevin R. Coffey, San Jose; Bruce A. Gurney, Santa Clara; David E. Heim, Redwood City; Haralambos Lefakis, San Jose; Daniele Mauri, San Jose; Virgil S. Speriosu, San Jose; Dennis R. Wilhoit, Morgan Hill, all of Calif.

[73] Assignee: International Business Machines Corporation, Armonk, N.Y.

[*] Notice: The term of this patent shall not extend beyond the expiration date of Pat. No. 5,465,185.

[21] Appl. No.: 259,815

[22] Filed: Jun. 15, 1994

[51] Int. Cl.⁶ ............................ G11B 5/127; G11B 5/33; H01L 43/00; G01R 33/02
[52] U.S. Cl. ........................ 360/113; 338/32 R; 324/252
[58] Field of Search ..................... 360/113; 338/32 R; 324/252

[56] References Cited

U.S. PATENT DOCUMENTS

| | | | |
|---|---|---|---|
| 4,103,315 | 7/1978 | Hempstead et al. | 360/110 |
| 4,914,358 | 4/1990 | Howard et al. | 360/113 |
| 4,949,039 | 8/1990 | Grunberg | 324/252 |
| 5,134,533 | 7/1992 | Friedrich et al. | 360/113 |
| 5,159,513 | 10/1992 | Dieny et al. | 360/113 |
| 5,206,590 | 4/1993 | Dieny et al. | 324/252 |
| 5,287,238 | 2/1994 | Baumgart et al. | 360/113 |
| 5,301,079 | 4/1994 | Cain et al. | 360/113 |
| 5,304,975 | 4/1994 | Saito et al. | 338/32 R |
| 5,313,186 | 5/1994 | Schuhl et al. | 338/32 R |
| 5,315,468 | 5/1994 | Lin et al. | 360/113 |
| 5,341,261 | 8/1994 | Dieny et al. | 360/113 |
| 5,404,377 | 4/1995 | Gurney et al. | 360/113 |
| 5,465,185 | 11/1995 | Heim et al. | 360/113 |

FOREIGN PATENT DOCUMENTS

0471946A2 2/1992 European Pat. Off. .

OTHER PUBLICATIONS

D. E. Heim et al., "Design and Operation of Spin Valve Sensors", IEEE Transactions on Magnetics, vol. 30, No. 2, Mar. 1994, pp. 316–321.

A. Schuhl et al., "Epitaxial Spin–valve Structures for Ultra–low–field Detection", Journal of Applied Physics, vol. 75, No. 10, Pt. 2B, May 15, 1994 pp. 7061–7063.

(List continued on next page.)

*Primary Examiner*—A. J. Heinz
*Assistant Examiner*—Adriana Giordana
*Attorney, Agent, or Firm*—Thomas R. Berthold

[57] ABSTRACT

A magnetic recording system uses an improved spin valve magnetoresistive (SVMR) sensor. The SVMR sensor has a self-pinned laminated layer as the pinned ferromagnetic layer in place of the conventional single-layer pinned layer. Because this laminated layer is "self-pinned", a hard bias or exchange bias layer is not needed. The self-pinned laminated layer has at least two ferromagnetic films antiferromagnetically coupled to one another across a thin antiferromagnetically (AF) coupling film. Since the two ferromagnetic films in this laminated layer have their magnetic moments aligned antiparallel, their two magnetic moments can be made to essentially cancel by making the two ferromagnetic films of substantially the same thickness. The magnetic field energy generated by the signal field acting on this laminated layer will be significantly less than the effective anisotropy energy of the laminated layer. This is because the former is proportional to the difference in thicknesses of the two ferromagnetic films in the laminated layer, while the latter is proportional to the sum of the thicknesses. As a result, the laminated layer will not rotate in the presence of the signal field, but will be "self-pinned". The elimination of the exchange bias layer previously required for pinning also eliminates the need for Ni—Mn and its associated high-temperature process.

30 Claims, 4 Drawing Sheets

OTHER PUBLICATIONS

Z. Zhang et al., "FMR in Strongly Coupled Co/Ru/Co Structures", Digests of International Magnetics Conference, Apr. 13–16, 1993, Stockholm, Sweden.

G. Binasch et al., "Enhanced Magnetoresistance in Layered Magnetic Structures with Antiferromagnetic Interlayer Exchange", Physical Review B, vol. 39, No. 7, Mar. 1, 1989, pp. 4828–4830.

B. Dieny et al., "Change in Conductance is the Fundamental Measure of Spin–valve Magnetoresistance", Applied Physics Letters, vol. 61, No. 17, Oct. 26, 1992, pp. 2111–2113.

B. Dieny, "Quantitative Interpretation of Giant Magnetoresistance Properties of Permalloy–based Spin–valve Structures", Europhysics Letters, vol. 17, No. 3, Jan. 14, 1992, pp. 261–267.

B. Dieny, "Classical Theory of Giant Magnetoresistance in Spin–valve Multilayers: Influence of Thicknesses, Number of Periods, Bulk and Interfacial Spin–dependent Scattering", Journal of Physics: Condensed Matter, vol. 4, 1992, pp. 4009–8020.

B. Dieny et al., "Giant Magnetoresistance in Soft Ferromagnetic Multilayers", Physical Review B, vol. 43, No. 1, Jan. 1, 1991, pp. 1297–1300.

Levy, "Giant Magnetoresistance in Magnetic Layered and Granular Materials", Science, vol. 256, May 15, 1992, pp. 972–973.

Parkin et al., "Oscillations in Exchange Coupling and Magnetoresistance in Metallic Superlattice Structures: Co/Ru, Co/Cr, and Fe/Cr", Physical Review Letters, vol. 64, No. 19, May 7, 1990, pp. 2304–2307.

Parkin et al., "Giant Magnetoresistance in Antiferromagnetic Co/Cu Multilayers", Applied Physics Letters, vol. 58, No. 23, Jun. 10, 1991, pp. 2710–2712.

Parkin et al., "Spin Engineering: Direct Determination of the Ruderman–Kittel–Kasuya–Yosida Far–field Range Function in Ruthenium", Physical Review B, vol. 44, No. 13, Oct. 1, 1991, pp. 7131–7134.

Parkin et al., "Oscillatory Magnetic Exchange Coupling Through Thin Copper Layers", Physical Review Letters, vol. 66, No. 16, Apr. 22, 1991, pp. 2152–2155.

Parkin, "Systematic Variation of the Strength and Oscillation Period of Indirect Magnetic Exchange Coupling Through the 3d, 4d, and 5d Transition Metals", Physical Review Letters, vol. 67, No. 25, Dec. 16, 1991, pp. 3598–3601.

Parkin, "Giant Magnetoresistance and Oscillatory Interlayer Exchange Coupling in Copper Based Multilayers", Materials Research Society Symposium Proceedings, vol. 231, 1992, pp. 211–216.

Pennisi, "Magnetic Advantage: Magnetic Fields Make New Thin Films Better Conductors", Science News, vol. 142, Aug. 29, 1992, pp. 140–142.

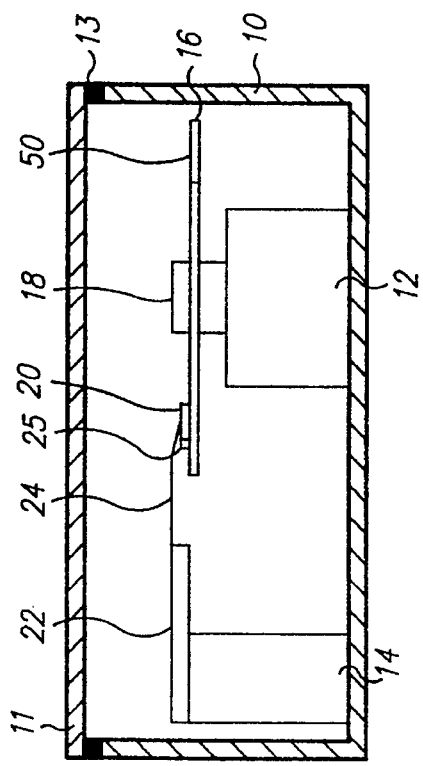
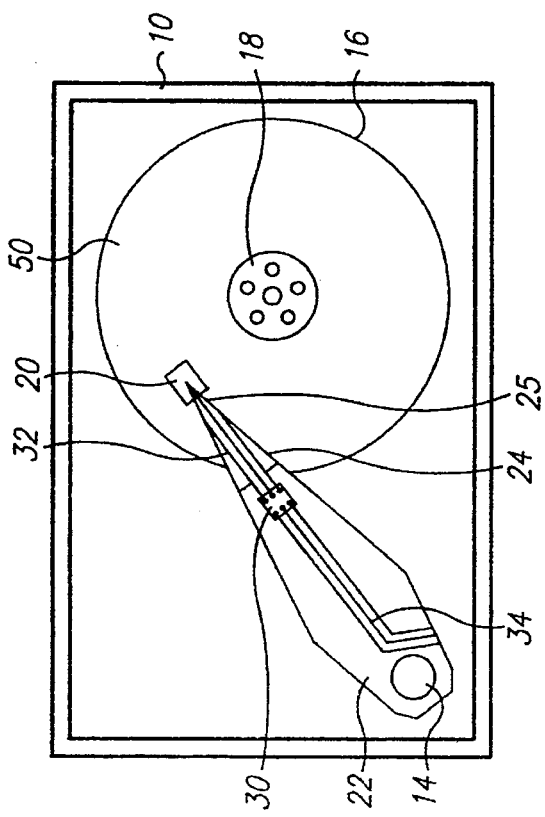
FIG. 1 (PRIOR ART)
FIG. 2 (PRIOR ART)

SPIN VALVE MAGNETORESISTIVE SENSOR WITH SELF-PINNED LAMINATED LAYER AND MAGNETIC RECORDING SYSTEM USING THE SENSOR

Related Application

This application is related to copending application Ser. No. 08/139,477, filed Oct. 15, 1993.

TECHNICAL FIELD

This invention relates to a magnetoresistive (MR) sensor based on the spin valve effect for sensing magnetic fields, and to magnetic recording systems which incorporate such sensors.

BACKGROUND OF THE INVENTION

An MR sensor detects magnetic field signals through the resistance changes of a read element, fabricated of a magnetic material, as a function of the strength and direction of magnetic flux being sensed by the read element. The conventional MR sensor, such as that used in the IBM "Corsair" disk drive, operates on the basis of the anisotropic magnetoresistive (AMR) effect in which a component of the read element resistance varies as the square of the cosine of the angle between the magnetization in the read element and the direction of sense current flow through the read element. Recorded data can be read from a magnetic medium because the external magnetic field from the recorded magnetic medium (the signal field) causes a change in the direction of magnetization in the read element, which in turn causes a change in resistance in the read element and a corresponding change in the sensed current or voltage.

A different and more pronounced magnetoresistance, called giant magnetoresistance (GMR) or spin valve magnetoresistance (SVMR), has been observed in a variety of magnetic multilayered structures, the essential feature being at least two ferromagnetic metal layers separated by a nonferromagnetic metal layer. This GMR effect has been found in a variety of systems, such as Fe/Cr or Co/Cu multilayers exhibiting strong antiferromagnetic coupling of the ferromagnetic layers, as well as in essentially uncoupled layered structures in which the magnetization orientation in one of the two ferromagnetic layers is fixed or pinned. The physical origin is the same in all types of structures: the application of an external magnetic field causes a variation in the relative orientation of the magnetizations of neighboring ferromagnetic layers. This in turn causes a change in the spin-dependent scattering of conduction electrons and thus the electrical resistance of the structure. The resistance of the structure thus changes as the relative alignment of the magnetizations of the ferromagnetic layers changes.

A particularly useful application of GMR is a sandwich structure comprising two essentially uncoupled ferromagnetic layers separated by a nonmagnetic metallic spacer layer in which the magnetization of one of the ferromagnetic layers is "pinned". The pinning may be achieved by depositing onto the ferromagnetic layer to be pinned an antiferromagnetic iron-manganese (Fe—Mn) layer so that these two adjacent layers are exchange coupled. The unpinned or "free" ferromagnetic layer has the magnetization of its extensions (those portions of the free layer on either side of the central sensing region) also fixed, but in a direction perpendicular to the magnetization of the pinned layer so that only the magnetization of the free layer central region is free to rotate in the presence of an external field. Typically, the magnetization in the free layer extensions is also fixed by exchange coupling to an antiferromagnetic layer. However, the antiferromagnetic material used for this must be different from the Fe—Mn antiferromagnetic material used to pin the pinned layer. The resulting structure is a spin valve magnetoresistive (SVMR) sensor in which only the free ferromagnetic layer is free to rotate in the presence of an external magnetic field. U.S. Pat. No. 5,206,590, assigned to IBM, discloses a basic SVMR sensor. U.S. Pat. No. 5,159,513, also assigned to IBM, discloses a SVMR sensor in which at least one of the ferromagnetic layers is of cobalt or a cobalt alloy, and in which the magnetizations of the two ferromagnetic layers are maintained substantially perpendicular to each other at zero externally applied magnetic field by exchange coupling of the pinned ferromagnetic layer to an antiferromagnetic layer.

The SVMR sensor that has the most linear response and the widest dynamic range is one in which the magnetization of the pinned ferromagnetic layer is parallel to the signal field and the magnetization of the free ferromagnetic layer is perpendicular to the signal field. In the case where the SVMR sensor is to be used in a horizontal magnetic recording disk drive, this means that the plane of the sensor is perpendicular to the disk surface with the magnetization of the pinned layer oriented perpendicular to, and the magnetization of the free layer oriented parallel to, the disk surface. One difficulty in achieving this magnetization orientation is caused by the dipole field generated by the pinned layer. The pinned layer has a net magnetic moment and thus essentially acts as a macroscopic dipole magnet whose field acts on the free layer. In SVMR sensors where the height of the read element is relatively small, the result of this magnetostatic coupling is that the magnetization direction in the free layer is not uniform. This causes portions of the sensor to saturate prematurely in the presence of the signal field, which limits the sensor's dynamic range and thus the recording density and overall performance of the magnetic recording system.

The related copending '477 application relates to a SVMR sensor that addresses this problem by the use of a multiple film, laminated, pinned ferromagnetic layer in place of the conventional single-layer pinned layer. The laminated pinned layer has at least two ferromagnetic films antiferromagnetically coupled to one another across a thin antiferromagnetically (AF) coupling film. Since the pinned ferromagnetic films have their magnetic moments aligned antiparallel with one another, the two moments can be made to essentially cancel one another. As a result, there is essentially no dipole field to adversely affect the free ferromagnetic layer.

In SVMR sensors that use either the single-layer pinned layer or the laminated pinned layer described in the copending application, the preferred method of pinning the layer is by exchange coupling with an Fe—Mn antiferromagnetic layer. The use of Fe—Mn as the exchange coupling layer presents several problems. The exchange field strength generated by the Fe—Mn is highly sensitive to temperature. As the temperature increases, the Fe—Mn "softens" and its ability to fix the magnetization of the pinned ferromagnetic layer decreases. Thus, SVMR sensors can be damaged by electrostatic discharge (ESD) current and the resultant heating of the Fe—Mn. Fe—Mn is also much more susceptible to corrosion than the other materials used in the SVMR sensor. This fact requires careful control of the fabrication process steps and the use of protective materials for the SVMR. The use of Fe—Mn also requires that the antiferromagnetic material used to exchange bias the extensions of the free ferromagnetic layer be made of a different material, preferably Ni—Mn. To provide sufficient exchange coupling field strength, the Ni—Mn must be annealed at approximately 240° C. At this temperature, interdiffusion of the other materials into the free ferromagnetic layer can occur. This can result in decreased magnetoresistance, increased anisotropy field strength, and a large change in magnetostriction of the free ferromagnetic layer.

What is needed is a SVMR sensor that has none of the disadvantages associated with an Fe—Mn exchange coupling layer, and has a pinned ferromagnetic layer that causes minimal magnetostatic coupling with the free ferromagnetic layer.

SUMMARY OF THE INVENTION

The invention is an improved SVMR sensor and magnetic recording system incorporating the sensor. The SVMR sensor uses a self-pinned laminated layer as the pinned ferromagnetic layer in place of the conventional single-layer pinned layer. Because this laminated layer is "self-pinned", a hard bias or exchange bias layer is not needed. The self-pinned laminated layer has at least two ferromagnetic films antiferromagnetically coupled to one another across a thin antiferromagnetically (AF) coupling film. Since the two ferromagnetic films in this laminated layer have their magnetic moments aligned antiparallel, their two magnetic moments can be made to essentially cancel by appropriate choice of thicknesses. The magnetic field energy generated by the signal field acting on this laminated layer will be significantly less than the effective anisotropy energy of the laminated layer. This is because the former is proportional to the difference in thicknesses of the two ferromagnetic films in the laminated layer, while the latter is proportional to the sum of the thicknesses. As a result, the laminated layer will not rotate significantly in the presence of the signal field, but will be "self-pinned". The elimination of the exchange bias layer previously required for pinning also eliminates the need for Ni—Mn and its associated high-temperature process, since other antiferromagnets such as Fe—Mn—Cr or NiO can substitute for it.

For a fuller understanding of the nature and advantages of the present invention, reference should be made to the following detailed description taken together with the accompanying figures.

BRIEF DESCRIPTION OF THE DRAWING

FIG. 1 is a simplified block diagram of a magnetic recording disk drive for use with the SVMR sensor according to the present invention.

FIG. 2 is a top view of the disk drive of FIG. 1 with the cover removed.

DETAILED DESCRIPTION OF THE INVENTION

PRIOR ART

Figure 3:
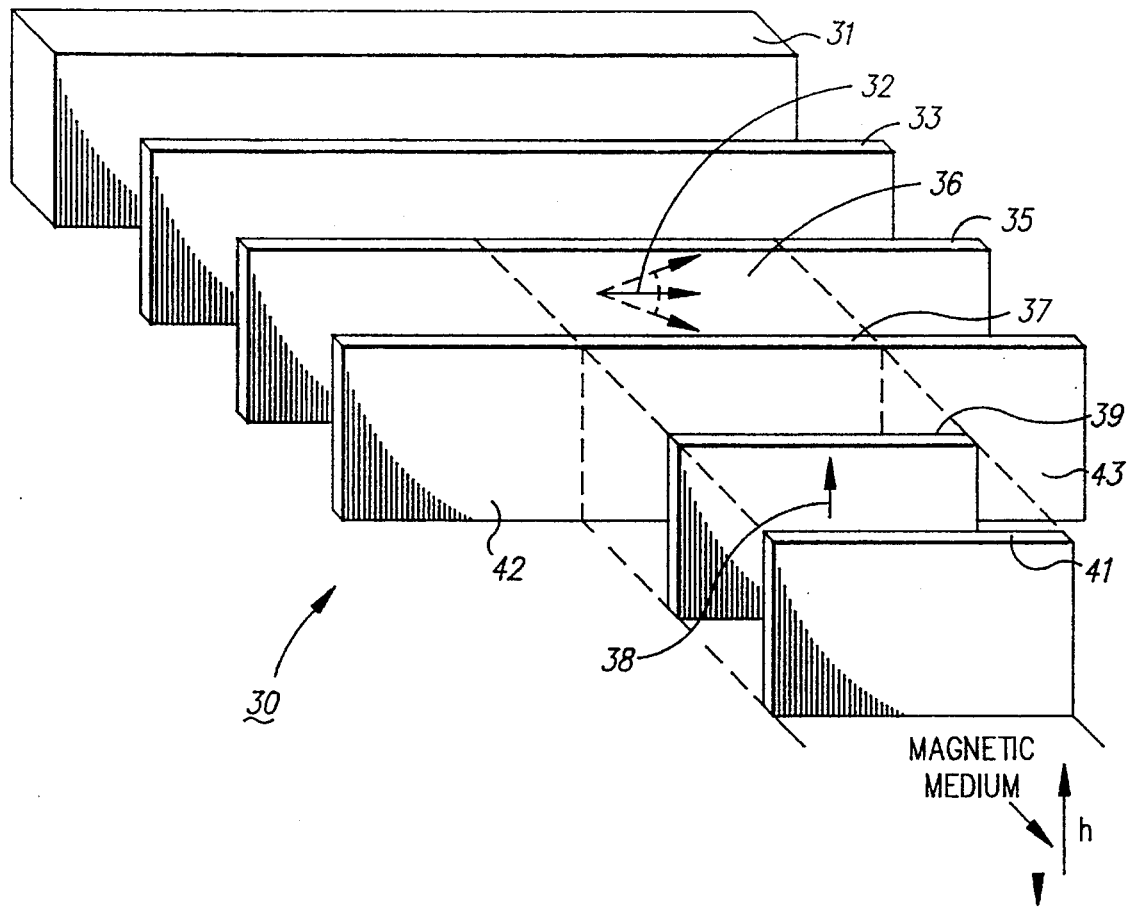
FIG. 3 is an exploded perspective view of a prior art SVMR sensor showing the pinned ferromagnetic layer and its associated exchange bias layer.

Although the SVMR sensor of the present invention will be described as embodied in a magnetic disk storage system, as shown in FIG. 1, the invention is also applicable to other magnetic recording systems, such as a magnetic tape recording system, and to magnetic random access memory systems wherein a magnetoresistive element serves as a bit cell.

Referring to FIG. 1, there is illustrated in sectional view a schematic of a prior art disk drive of the type using an MR sensor. The disk drive comprises a base 10 to which are secured a disk drive motor 12 and an actuator 14, and a cover 11. The base 10 and cover 11 provide a substantially sealed housing for the disk drive. Typically, there is a gasket 13 located between base 10 and cover 11 and a small breather port (not shown) for equalizing pressure between the interior of the disk drive and the outside environment. A magnetic recording disk 16 is connected to drive motor 12 by means of hub 18 to which it is attached for rotation by the drive motor 12. A thin lubricant film 50 is maintained on the surface of disk 16. A read/write head or transducer 25 is formed on the trailing end of a carrier, such as an air-bearing slider 20. Transducer 25 may be an inductive read and write transducer or an inductive write transducer with a SVMR read transducer of the type to be described. The slider 20 is connected to the actuator 14 by means of a rigid arm 22 and a suspension 24. The suspension 24 provides a biasing force which urges the slider 20 onto the surface of the recording disk 16. During operation of the disk drive, the drive motor 12 rotates the disk 16 at a constant speed, and the actuator 14, which is typically a linear or rotary voice coil motor (VCM), moves the slider 20 generally radially across the surface of the disk 16 so that the read/write head may access different data tracks on disk 16.

FIG. 2 is a top view of the interior of the disk drive with the cover 11 removed, and illustrates in better detail the suspension 24 which provides a force to the slider 20 to urge it toward the disk 16. The suspension may be a conventional type of suspension, such as the well-known Watrous suspension, as described in IBM's U.S. Pat. No. 4,167,765. This type of suspension also provides a gimbaled attachment of the slider which allows the slider to pitch and roll as it rides on the air bearing. The data detected from disk 16 by the transducer 25 is processed into a data readback signal by signal amplification and processing circuitry in the integrated circuit chip 15 located on arm 22. The signals from transducer 25 travel via flex cable 17 to chip 15, which sends its output signals via cable 19.

The above description of a typical magnetic disk storage system, and the accompanying FIGS. 1 and 2, are for representation purposes only. It should be apparent that disk storage systems may contain a large number of disks and actuators, and each actuator may support a number of sliders. In addition, instead of an air-bearing slider, the head carrier may be one which maintains the head in contact or near contact with the disk, such as in liquid bearing and other contact recording disk drives.

A prior art SVMR sensor 30 is shown in FIG. 3. The films forming the completed sensor are supported on a suitable substrate 31. The SVMR sensor 30 may form part of transducer 25 in the disk drive system of FIGS. 1 and 2, and the substrate 31 may be the trailing end of the head carrier or slider 20.

A buffer layer 33 is deposited on substrate 31, followed by a first thin layer 35 of soft ferromagnetic material. A thin nonferromagnetic metallic spacer layer 37, a second thin layer 39 of ferromagnetic material, and a thin layer 41 of an exchange biasing material having relatively high electrical resistance and being in direct contact with the ferromagnetic layer 39 are deposited over layer 35. Layers 37, 39, 41 are then etched away to have a predetermined width generally corresponding to the width of the data track on the magnetic medium, such as disk 16. Antiferromagnetic layers 42, 43 are formed directly on the extensions on the sides of central sensing region 36 of ferromagnetic layer 35. Not shown in FIG. 3 are the capping layer for corrosion protection and the electrical leads that are patterned on layers 42, 43.

In the absence of an externally applied magnetic field from the recorded magnetic disk 16, the magnetizations of the two layers 35, 39 of ferromagnetic material are oriented at an angle, preferably of about 90 degrees, with respect to each other, as indicated by arrows 32 and 38, respectively. The ferromagnetic layer 35 is called the "free" ferromagnetic layer in that the magnetization in its central region 36 is free to rotate its direction in response to an externally applied magnetic field (such as magnetic field h as shown in FIG. 3), as shown by the dashed arrows on layer 35. The ferromagnetic layer 39 is called the "pinned" ferromagnetic layer because its magnetization direction is fixed or pinned in a preferred orientation, as shown by the arrow 38. Layer 41 provides a biasing field by exchange coupling and thus pins the magnetization of the ferromagnetic layer 39 in a preferred direction (arrow 38) so that it cannot rotate its direction significantly in the presence of an applied external magnetic field having a strength in the range of the signal field from disk 16. Similarly, the layers 42, 43 provide longitudinal biasing by exchange coupling to the extensions of the central region 36 of free ferromagnetic layer 35. This assures that the magnetization of the central sensing region 36 of the free ferromagnetic layer 35 is maintained generally perpendicular to the magnetization of pinned ferromagnetic layer 39 in the absence of an externally applied magnetic field.

Figure 4:
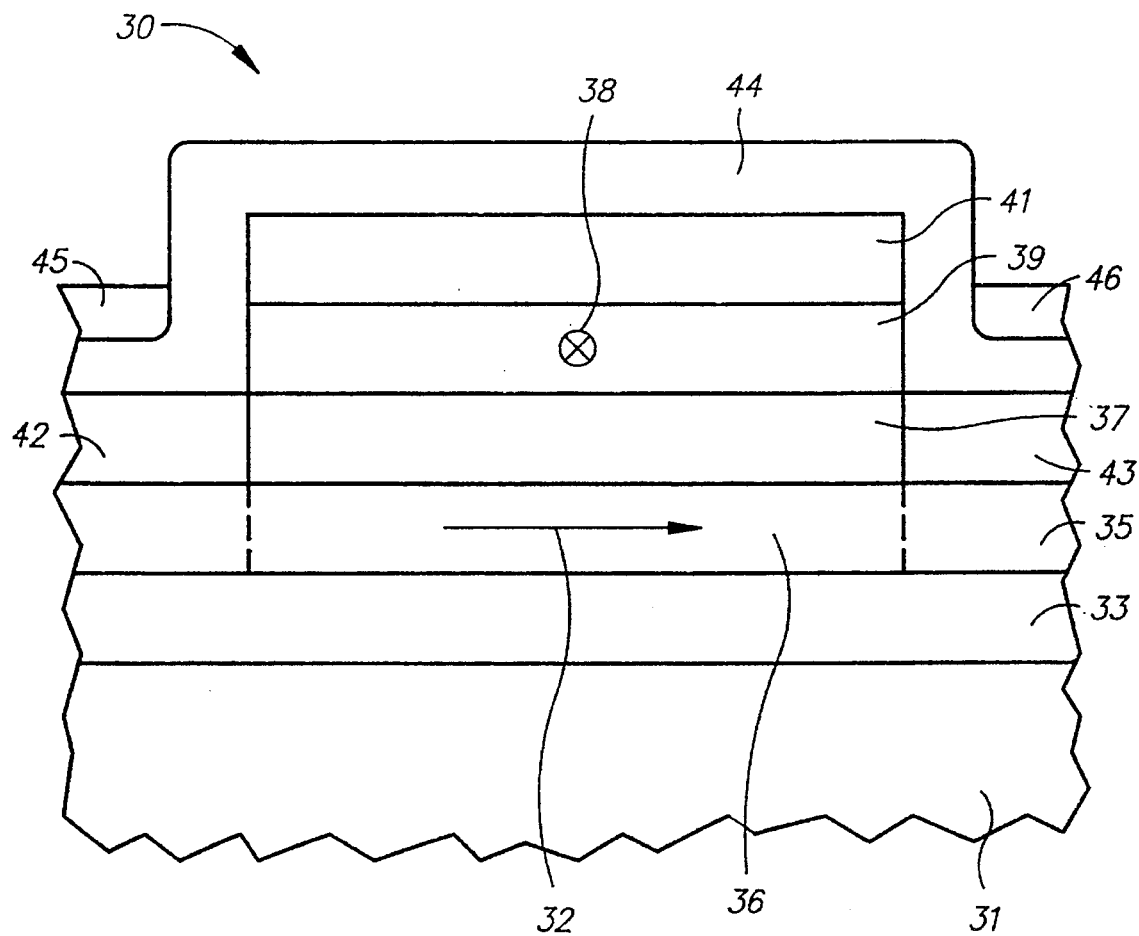
FIG. 4 is a view of the prior art SVMR sensor of FIG. 3 as seen from the disk and also showing the capping layer and electrical leads.

FIG. 4 is a view of the structure of FIG. 3 as it would appear looking up from the surface of disk 16. FIG. 4 also shows the capping layer 44 and patterned electrical leads 45, 46 for making electrical connection to the sensor 30. The pinned ferromagnetic layer 39 has a net macroscopic magnetic moment, represented by arrow 38 into the paper. The magnetic field associated with this magnetic moment has an effect on the free ferromagnetic layer 35 in its central sensing region 36. The magnetization (arrow 32) of free layer 35 is formed at an angle of approximately 90 degrees to that of the pinned layer 39. The field from the pinned layer 39 causes the magnetization in the free layer 35 to be nonuniform. The nonuniformity of the magnetization causes portions of the sensor 30 to saturate prematurely in the presence of an externally applied signal field from the magnetic medium.

The use of antiferromagnetic exchange coupling layers 41 and 42, 43 is the preferred method of pinning the magnetizations of the ferromagnetic layer 39 and the extensions of free layer 35, respectively. However, the second ferromagnetic layer 39 and the extensions of free layer 35 can have their magnetizations pinned by alternative methods, such as the use of a hard bias layer (not shown) as is known in the art. The exchange bias layers 41 and 42, 43 are typically made of a suitable antiferromagnetic material, such as iron-manganese (Fe—Mn) or nickel-manganese (Ni—Mn). However, the layer 41 must be made of a different antiferromagnetic material than that used for the layers 42, 43. This is because the magnetization of layer 41 must be made perpendicular to the magnetizations of layers 42, 43. During processing, the antiferromagnetic material is subjected to an applied magnetic field while heated to a specific critical temperature to orient its magnetization. Different materials must be selected so that when one material is raised to its critical temperature to orient its magnetization, this temperature will be below the critical temperature of the other material and its magnetization will be unaffected. Thus, typically layer 41 is made of Fe—Mn, which has a critical temperature of about 160° C., and the layers 42, 43 are made of Ni—Mn, which has a critical temperature of about 240° C.

The above-described embodiment is for a SVMR sensor used in a magnetic recording disk drive. However, the SVMR element of the present invention is also applicable for use in magnetic random access memory systems. In such an embodiment, the SVMR element serves as a bit cell and the magnetizations of the free and pinned layers would be oriented parallel or antiparallel, rather than perpendicular.

Preferred Embodiments

In the present invention, the single-layer pinned ferromagnetic layer in the SVMR sensor is replaced by a self-pinned laminated structure comprising at least two ferromagnetic films separated by a thin antiferromagnetic coupling film. The antiferromagnetic layer for pinning the pinned layer is eliminated. The two ferromagnetic films making up the laminated pinned layer are antiferromagnetically coupled to one another by means of the appropriate type and thickness of the antiferromagnetic coupling film so that their magnetizations are oriented antiparallel to one another. The preferred embodiment of the SVMR sensor according to the present invention is shown schematically in FIG. 5 which, like FIG. 4, is a view of the structure as it would appear looking up from the surface of the magnetic medium. However, in FIG. 5 the SVMR sensor 60 is shown as fabricated with the pinned and free layers inverted from the prior art SVMR sensor of FIG. 4.

Figure 5:
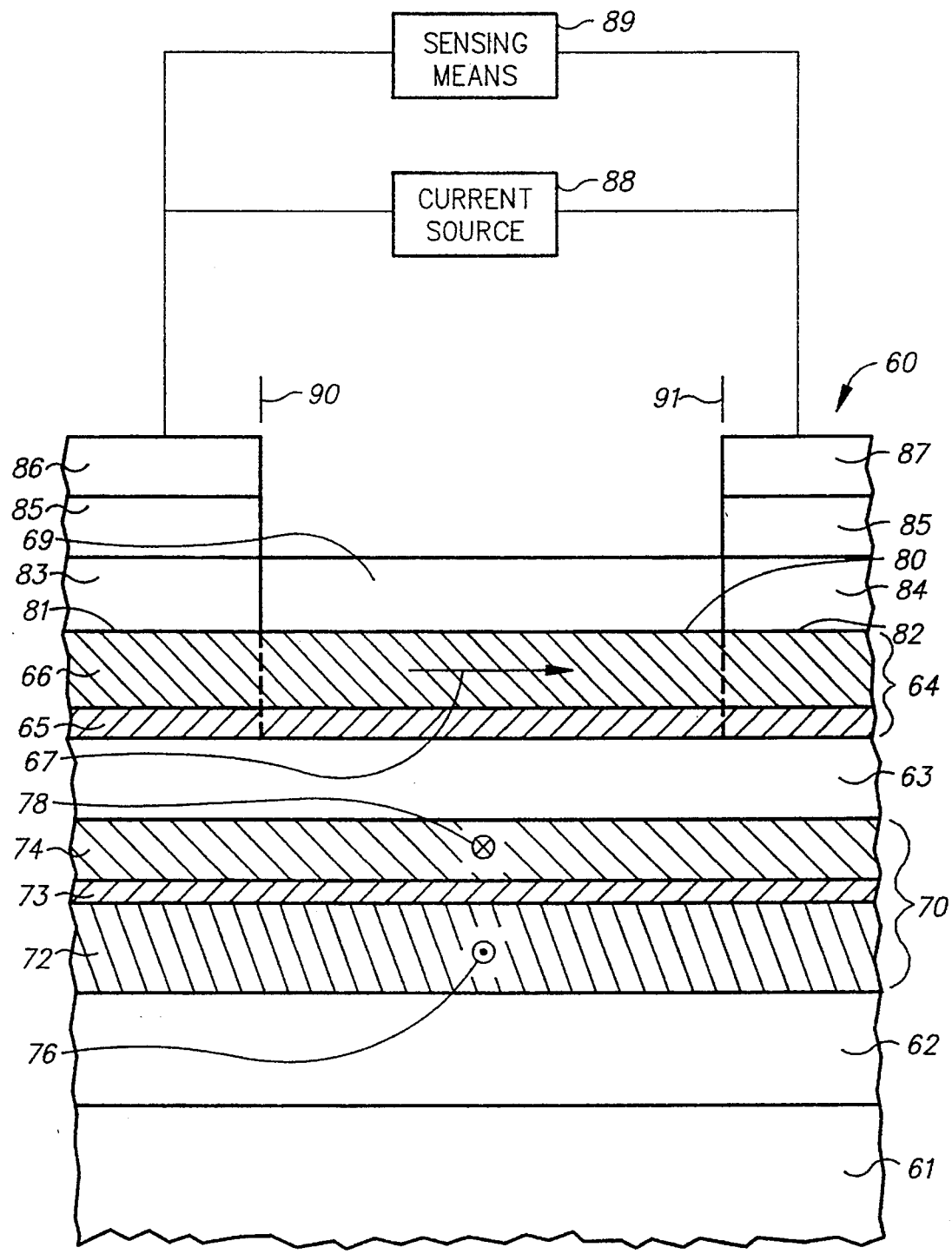
FIG. 5 is a view of the SVMR sensor according to the present invention as seen from the disk.

The SVMR sensor 60 as shown in FIG. 5 is fabricated by DC magnetron sputter deposition in the presence of an applied magnetic field. First, a 50–100Å film of tantalum (Ta) is deposited as a buffer layer 62 onto a substrate 61, which in this embodiment was glass. However, the substrate could also be of other materials, such as a semiconductor material or a ceramic material such as used for conventional sliders. The pinned ferromagnetic layer 70, which replaces the single-layer pinned layer 39 in the prior art structure of FIG. 3, is a self-pinned laminated structure. It comprises a first cobalt (Co) film 72 having a thickness in the range of 20–50Å formed directly on the Ta buffer layer 62, a 3–10Å ruthenium (Ru) film 73 deposited onto the first Co film 72, and a second Co film 74 of 10–40Å thickness formed on the Ru film 73. The easy axes of magnetizations of films 72, 74 are oriented perpendicular to the plane of the figure (into the paper) due to the applied field. The directions of magnetization of the two films 72, 74 will be set later after all the films in the SVMR sensor 60 have been deposited. These magnetization directions are as indicated, i.e., toward the medium for film 72 as shown by arrow 76 and away from the medium for film 74 as shown by arrow 78, although the reverse would also work.

A copper (Cu) layer 63 is then deposited onto the second Co film 74 to a thickness in the range of 20–40Å to serve as the nonferromagnetic metallic spacer. While Cu was used as the spacer layer in this embodiment, other nonferromagnetic metallic materials with high electrical conductivity, such as silver (Ag), gold (Au), and their alloys, can be used.

Next, the free ferromagnetic layer 64 is formed over spacer layer 63. It comprises a Co film 65 of 3–12Å thickness deposited on the Cu spacer layer 63 and a Ni—Fe film 66 of 15–60Å thickness deposited over the Co film 65.

Both of the films 65, 66 making up the free ferromagnetic layer 64 are deposited in the presence of the same applied magnetic field used during the deposition of the pinned films 72, 74 so that this field also defines the easy axis of magnetization of the free layer 64. Alternatively, the applied field could be rotated 90 degrees from its previous direction. The magnetization direction of the free ferromagnetic layer 64 will be set later after all of the films in the SVMR sensor 60 have been deposited and patterned. This magnetization direction will be as indicated by arrow 67, i.e., generally parallel to the medium and perpendicular to the magnetization directions 76, 78 of the pinned films 72, 74, respectively. While in the preferred embodiment the free ferromagnetic layer 64 includes a thin Co film 65 adjacent to the Cu spacer layer 63, the film 65 can also be a Co alloy. It is also possible to form the free ferromagnetic layer 64 of a single ferromagnetic material. The Co or Co alloy film 65 increases the magnetoresistance of the sensor but is maintained relatively thin, in the range of 2–20Å to minimize the effect of the relatively "hard" magnetic Co material on the permeability of the sensor.

Following the deposition of the free ferromagnetic layer 64, a first Ta layer 69 is formed over the free ferromagnetic layer 64. Next, the Ta layer 69 on top of the central region 80 of the free ferromagnetic layer 64 is masked. The structure is then returned to the sputter deposition chamber with the applied field oriented perpendicular to its original direction. The Ta layer 69 is then etched down to expose the lateral extensions 81, 82 of the free ferromagnetic layer 64. The etching of the Ta defines edges 90, 91 of the central sensing region 80 of the free ferromagnetic layer 64. The width of the region 80 between edges 90, 91 is selected to generally match the width of the data track on the magnetic medium. Since this width is in the micron (10,000Å) range, the drawing of FIG. 5 is not made to scale so that the sensor films can be shown.

Antiferromagnetic exchange biasing layers 83, 84 are then deposited directly on the lateral extensions 81, 82 of the free ferromagnetic film 66. This causes the direction of magnetizations of the extensions 81, 82 to be set perpendicular to their original easy axes. Although not shown in FIG. 5, it may be desirable to first deposit additional Ni—Fe onto the lateral extensions 81, 82 because during the previous etching step some of the Ni—Fe may have been removed from film 66. In the preferred embodiment, the material used for the layers 83, 84 is Fe—Mn—Cr. The Fe—Mn—Cr is then subjected to an external magnetic field and heated to 180° C., which is considerably less than the 240° C. temperature required for Ni—Mn. The Fe—Mn—Cr layers 83, 84 provide longitudinal biasing of the free layer extensions 81, 82 to fix their magnetizations in the direction of arrow 67. This additional step of heating and cooling in the field ensures that the desired magnetization orientations of the extensions 81, 82 are maintained.

A capping layer 85 of 40–60Å of Ta is then deposited over the Fe—Mn—Cr antiferromagnetic exchange bias layers 83, 84 to provide corrosion resistance for the sensor 60. Other suitable capping materials are high resistivity materials, such as ruthenium (Ru), zirconium (Zr), or alloys of Cu and gold (Au).

FIG. 5 also illustrates schematically the means for connecting the SVMR sensor 60 to sensing circuitry in the magnetic recording system. Electrical leads 86, 87, preferably formed of Au or Au covered with Ta, are deposited on the capping layer 85 outside the sensing region 80 to form a circuit path between the SVMR sensor 60 and a current source 88 and a sensing means 89.

After the sensor geometry is completed, the directions of the magnetizations of layers 72, 74 are set by applying a sufficiently large magnetic field (~10 Koe). The direction of the magnetization of layer 66 is self-setting due to its shape anisotropy and the effect of the pinned extensions 81, 82.

In the preferred embodiment, a magnetic signal in the medium is sensed by the sensing means 89 detecting the change in resistance, deltaR, of the SVMR 60 as the magnetization of the central region 80 of the free ferromagnetic layer 64 rotates in response to the applied magnetic signal from the recorded medium.

The two Co films 72, 74 in the laminated pinned layer 70 have magnetization directions indicated by arrows 76, 78, respectively. The antiparallel alignment of the magnetizations of the two Co films 72, 74 is due to an antiferromagnetic exchange coupling through the Ru antiferromagnetic coupling film 73. Because of this antiferromagnetic coupling, and because the two Co films 72, 74 can have substantially the same thickness, the magnetic moments of each of the films can essentially cancel each other. The net magnetic moment of the laminated layer 70 is thus substantially smaller than the sum of the magnetic moments of the two individual films 72, 74.

While in the embodiment shown in FIG. 5 the self-pinned laminated ferromagnetic layer 70 comprises two antiferromagnetically coupled films 72, 74 separated by a single antiferromagnetic coupling film 73, the layer 70 can comprise a multiple number of ferromagnetic films separated by antiferromagnetic coupling films.

Depending upon the materials selected for the ferromagnetic films 72, 74 and antiferromagnetic coupling film 73 in the laminated pinned layer 70, there is a preferred antiferromagnetic coupling film thickness at which the ferromagnetic films become strongly antiferromagnetically coupled. The antiferromagnetic coupling film thickness must not be so thin, however, that a significant number of pin holes occur in the film, which would affect its antiferromagnetic coupling strength. The strength of the antiferromagnetic coupling field exhibits an oscillatory behavior as a function of increasing antiferromagnetic film thickness. This oscillatory coupling relationship for selected material combinations is described by Parkin et al. in *Phys. Rev. Lett.*, Vol. 64, p. 2304 (1990).

While the laminated pinned layer in the SVMR sensor 60 has been shown with the preferred materials of Co and Ru as the ferromagnetic and antiferromagnetic coupling film, respectively, other material combinations are possible, such as iron/chromium (Fe/Cr), and other ferromagnetic materials (such as Fe, Ni, Co or alloys of Fe, Ni, or Co) with other antiferromagnetic coupling films (such as Cr, rhodium (Rh), iridium (Ir), and their alloys). However, for each such material combination, the oscillatory exchange coupling relationship would have to be determined, if not already known, so that the thickness of the antiferromagnetic coupling film can be selected to assure antiferromagnetic coupling between the two ferromagnetic films.

If the "live" thicknesses of the two ferromagnetic films 72, 74 forming the laminated pinned layer 70 are identical, then in theory the net moment of the pinned layer 70 would be zero because each of the magnetic moments would precisely cancel. (By "live" thickness is meant the actual thickness of the pinned films 72, 74 that possesses a magnetic moment, and thus excludes the surfaces of the films which may have become mixed with adjacent films or oxidized. Thus, the live thickness of each of the films 72, 74 is less than its total thickness.) Because it is not possible to precisely form each of the films to the exact same thickness, the net moment of the pinned layer 70 will likely be a small but nonzero value as a natural result of the normal deposition process. However, it is desirable to deliberately deposit one of the pinned ferromagnetic films to a thickness slightly greater than that of the other film, as described with respect to FIG. 5, so that there is a small nonzero net magnetic moment in the pinned layer. This assures that the magnetization of the pinned layer 70 is stable in the presence of small magnetic fields so that the direction of its magnetization is predictable.

The key aspect of the SVMR 60 of the present invention is the absence of either a hard bias layer or an antiferromagnetic layer adjacent to the pinned ferromagnetic layer 70 for pinning the magnetization of the pinned ferromagnetic layer 70. The lack of this layer eliminates additional processing steps and permits Fe—Mn (or Fe—Mn—Cr in the preferred embodiment) to be used as the antiferromagnetic layer for longitudinally biasing the extensions 81, 82 of the free ferromagnetic layer 63. Thus, the problems associated with the use of Ni—Mn can be eliminated.

In contrast to the prior art use of single-layer pinned layers with associated hard or exchange bias layers, a hard bias layer or an exchange bias layer is not needed in the SVMR sensor 60 of the present invention because the laminated layer 70 is "self-pinned". Because the two ferromagnetic films 72, 74 in the laminated layer 70 are close to the same thickness, but their magnetizations are in opposite directions, the net magnetic moment of layer 70 is small. An externally applied field will generate a magnetostatic energy that is related to the product of this small net moment times the applied field strength. This applied field energy will not cause the laminated layer 70 to rotate because this energy will be less than the effective anisotropy field energy of the laminated layer 70. The reason the applied field energy is less than the effective anisotropy field energy is that it is proportional to the difference of the live thicknesses of the two ferromagnetic films 72, 74, while the effective anisotropy field energy is proportional to the sum of the live thicknesses of these two films. Also, for the laminated layer 70 to be self-pinned, the intrinsic anisotropy field of each of the films 72, 74 must be several times larger than the coupling field from the free layer 64. This is accomplished by the choice of materials for the laminated pinned layer 70 for a given spacer layer/free layer combination. For example, in the embodiment described and shown in FIG. 5, the intrinsic anisotropy field of each Co film 72, 74 is approximately 60 Oe, whereas the coupling field from the free layer 64 is below 20 Oe. The laminated layer 70 will thus not rotate in the presence of an applied signal field and is thus self-pinned.

The SVMR sensor according to the present invention has significantly improved performance over the prior art. Compared to SVMR sensors that are subjected to the 240° C. processing step required when Ni—Mn is used, the magnetoresistance (deltaR/R) is increased approximately 20–30% and the anisotropy field of the free ferromagnetic layer is reduced approximately 70%. Also, the change in magnetostriction due to the high temperature processing step is reduced by a factor of 10. As a result, the signal response has been calculated to be 5 millivolts/micron, which is approximately a 300% improvement over the prior art SVMR sensor.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A spin valve magnetoresistive element comprising:

first and second layers of ferromagnetic material separated by a spacer layer of nonmagnetic material, the magnetization direction of said first layer of ferromagnetic material being oriented at an angle relative to the magnetization direction of said second layer of ferromagnetic material at zero applied magnetic field, the second layer of ferromagnetic material being a laminated layer comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned antiparallel with one another and remain antiparallel in the presence of an applied magnetic field, the laminated layer having a net magnetic moment substantially less than the sum of the magnetic moments of its first and second ferromagnetic films, whereby the magnetic field energy generated in the laminated layer by the applied magnetic field is insufficient to cause rotation of the magnetizations of the ferromagnetic films; wherein the element includes no hard bias layer or exchange bias layer for pinning the magnetization of the second ferromagnetic layer.

2. A spin valve magnetoresistive element as in claim 1 wherein the antiferromagnetically coupling film in the second ferromagnetic layer consists essentially of Ru.

3. A spin valve magnetoresistive element as in claim 1 wherein the first and second ferromagnetic films in the second ferromagnetic layer consist essentially of Co.

4. A spin valve magnetoresistive element as in claim 1 wherein the first and second ferromagnetic films in the second ferromagnetic layer are made of a material selected from the group consisting of Co, Fe, Ni, Co alloy, Fe alloy, and Ni alloy, and wherein the antiferromagnetically coupling film in the second ferromagnetic layer is made of a material selected from the group consisting of Ru, Cr, Rh, Ir, Ru alloy, Cr alloy, Rh alloy, and Ir alloy.

5. A spin valve magnetoresistive element as in claim 1 wherein the first and second films in the second ferromagnetic layer have substantially the same magnetic moment.

6. A spin valve magnetoresistive element as in claim 1 wherein the nonmagnetic spacer layer comprises a material selected from the group consisting of Ag, Au, Cu, Ag alloy, Au alloy, and Cu alloy.

7. A spin valve magnetoresistive sensor comprising:

a substrate;

a laminated self-pinned layer formed over the substrate and comprising first and second ferromagnetic films and an antiferromagnetically coupling film between the first and second ferromagnetic films for aligning the directions of magnetizations of the first and second ferromagnetic films to be generally antiparallel, the laminated layer having a net magnetic moment substantially less than the sum of the magnetic moments of the first and second ferromagnetic films;

a nonmagnetic spacer layer formed on and in contact with the second ferromagnetic film of the self-pinned laminated layer;

a free ferromagnetic layer formed on and in contact with the spacer layer and having its magnetization oriented generally perpendicular to the magnetizations of the first and second ferromagnetic films of the self-pinned laminated layer in the absence of an applied magnetic field; and wherein the sensor has no hard bias layer or exchange bias layer for pinning the magnetizations of the first or second ferromagnetic films in the self-pinned laminated layer;

whereby in the presence of an applied magnetic field the magnetization of the free ferromagnetic layer rotates but the magnetic field energy generated in the laminated layer is insufficient to cause rotation of the magnetizations of the first or second ferromagnetic films and the magnetizations of the first and second ferromagnetic films remain self-pinned and antiparallel to one another.

8. A spin valve magnetoresistive sensor according to claim 7 wherein the free ferromagnetic layer has a central sensing region and extensions on the sides of the central sensing region, and further comprising layers of an alloy comprising Fe and Mn formed adjacent to the free ferromagnetic layer extensions for longitudinally biasing the magnetizations of the free layer extensions.

9. A spin valve magnetoresistive sensor as in claim 7 wherein the antiferromagnetically coupling film between the first and second films in the self-pinned laminated layer consists essentially of Ru.

10. A spin valve magnetoresistive sensor as in claim 7 wherein the first and second films in the self-pinned ferromagnetic layer are made of a material selected from the group consisting of Co, Fe, Ni Co alloy, Fe alloy, and Ni alloy, and wherein the antiferromagnetically coupling film is made of a material selected from the group consisting of Ru, Cr, Rh, Ir, Ru alloy, Cr alloy, Rh alloy, and Ir alloy.

11. A spin valve magnetoresistive sensor as in claim 7 wherein the first and second films in the self-pinned ferromagnetic layer have substantially the same magnetic moment.

12. A spin valve magnetoresistive sensor as in claim 7 wherein the nonmagnetic spacer layer between the free ferromagnetic layer and the self-pinned laminated layer comprises a material selected from the group consisting of Ag, Au, Cu, Ag alloy, Au alloy, and Cu alloy.

13. A spin valve magnetoresistive sensor as in claim 7 wherein the free ferromagnetic layer includes a thin film of Co or Co alloy adjacent to the spacer layer.

14. A spin valve magnetoresistive sensor as in claim 7 wherein the self-pinned laminated layer is located between the substrate and the free ferromagnetic layer.

15. A spin valve magnetoresistive sensor as in claim 14 further comprising a buffer layer between the substrate and the self-pinned laminated layer.

16. A spin valve magnetoresistive sensor as in claim 14 further comprising a capping layer formed over the free ferromagnetic layer.

17. A magnetic storage system comprising:

a magnetic storage medium having a plurality of tracks for the recording of data;

a magnetic transducer maintained close to the magnetic storage medium during relative motion between the magnetic transducer and the magnetic storage medium, the magnetic transducer including a spin valve magnetoresistive sensor comprising:

first and second layers of ferromagnetic material separated by a spacer layer of nonmagnetic material, the magnetization direction of said first layer of ferromagnetic material being at an angle relative to the magnetization direction of said second layer of ferromagnetic material at zero applied magnetic field, the second layer of ferromagnetic material comprising first and second ferromagnetic films antiferromagnetically coupled to one another and an antiferromagnetically coupling film located between and in contact with the first and second ferromagnetic films for coupling the first and second ferromagnetic films together antiferromagnetically so that their magnetizations are aligned antiparallel with one another and remain antiparallel in the presence of a magnetic field from the magnetic storage medium, the second ferromagnetic layer having a net magnetic moment substantially less than the sum of the magnetic moments of its first and second ferromagnetic films, wherein the sensor includes no hard bias layer or exchange bias layer for pinning the magnetization of the second ferromagnetic layer; and means coupled to the magnetoresistive sensor for detecting resistance changes in the magnetoresistive sensor responsive to magnetic fields representative of data bits recorded in the magnetic storage medium intercepted by the magnetoresistive sensor whereby in the presence of a magnetic field from the magnetic storage medium the magnetization of the first ferromagnetic layer rotates but the magnetic field energy generated in the second ferromagnetic layer is insufficient to cause rotation of the magnetizations of its first or second ferromagnetic films, and the magnetizations of the first and second ferromagnetic films thus remain self-pinned and antiparallel to one another.

18. A system as in claim 17 wherein the antiferromagnetically coupling film in the second ferromagnetic layer consists essentially of Ru.

19. A system as in claim 17 wherein the first and second ferromagnetic films in the second ferromagnetic layer consist essentially of Co.

20. A system as in claim 17 wherein the first and second ferromagnetic films in the second ferromagnetic layer are made of a material selected from the group consisting of Co, Fe, Ni, Co alloy, Fe alloy, and Ni alloy, and wherein the antiferromagnetically coupling film in the second ferromagnetic layer is made of a material selected from the group consisting of Ru, Cr, Rh, Ir, Ru alloy, Cr alloy, Rh alloy, and Ir alloy.

21. A system as in claim 17 wherein the first and second films in the second ferromagnetic layer have substantially the same magnetic moment.

22. A system as in claim 17 wherein the nonmagnetic spacer layer comprises a material selected from the group consisting of Ag, Au, Cu, Ag alloy, Au alloy, and Cu alloy.

23. A magnetic recording disk drive comprising:

a magnetic recording disk;

a motor connected to the disk for rotating the disk;

a spin valve magnetoresistive sensor for sensing magnetically recorded data on the disk, the sensor comprising:

a laminated self-pinned layer comprising first and second ferromagnetic films and an antiferromagnetically coupling film between the first and second ferromagnetic films for aligning the directions of magnetizations of the first and second ferromagnetic films to be generally antiparallel, the laminated self-pinned layer having a net magnetic moment substantially less than the sum of the magnetic moments of the first and second ferromagnetic films;

a nonmagnetic spacer layer formed on and in contact with the second ferromagnetic film of the self-pinned laminated layer;

a free ferromagnetic layer formed on and in contact with the spacer layer and having its magnetization oriented generally perpendicular to the magnetizations of the first and second ferromagnetic films of the self-pinned laminated layer in the absence of an applied magnetic field, the free ferromagnetic layer having a central sensing region and extensions on the sides of the central sensing region;

a layer of an alloy comprising Fe and Mn formed on and in contact with each of the free ferromagnetic layer extensions for longitudinally biasing the magnetizations of the free layer extensions; and wherein the sensor has no hard bias layer or exchange bias layer for pinning the magnetizations of the first or second ferromagnetic films in the self-pinned laminated layer;

whereby in the presence of an applied magnetic field from magnetically recorded data on the disk the magnetization of the free ferromagnetic layer rotates but the magnetic field energy generated in the laminated layer is insufficient to cause rotation of the magnetizations of the first or second ferromagnetic films in the laminated layer and the magnetizations of the first and second ferromagnetic films remain self-pinned and antiparallel to one another;

a carrier supporting the spin valve magnetoresistive sensor and having a substrate onto which the sensor is attached;

an actuator for moving the carrier generally radially across the disk so the sensor may access different regions of magnetically recorded data on the disk;

means connecting the carrier to the actuator for maintaining the carrier near the disk;

means electrically coupled to the sensor for detecting changes in resistance of the sensor in response to magnetic fields sensed by the sensor from the magnetically recorded disk; and means for supporting the motor and actuator.

24. A disk drive as in claim 23 wherein the antiferromagnetically coupling film between the first and second films in the self-pinned laminated layer consists essentially of Ru.

25. A disk drive as in claim 23 wherein the first and second films in the self-pinned ferromagnetic layer are made of a material selected from the group consisting of Co, Fe, Ni, Co alloy, Fe alloy, and Ni alloy, and wherein the antiferromagnetically coupling film is made of a material selected from the group consisting of Ru, Cr, Rh, Ir, Ru alloy, Cr alloy, Rh alloy, and Ir alloy.

26. A disk drive as in claim 23 wherein the nonmagnetic spacer layer between the free ferromagnetic layer and the self-pinned laminated layer comprises a material selected from the group consisting of Ag, Au, Cu, Ag alloy, Au alloy, and Cu alloy.

27. A disk drive as in claim 23 wherein the free ferromagnetic layer includes a thin film of Co or Co alloy adjacent to the spacer layer.

28. A disk drive as in claim 23 wherein the self-pinned laminated layer is located between the substrate and the free ferromagnetic layer.

29. A disk drive as in claim 28 further comprising a buffer layer between the substrate and the self-pinned laminated layer.

30. A disk drive as in claim 28 further comprising a capping layer formed over the free ferromagnetic layer.

* * * * *